United States Patent [19]

Walters

[11] Patent Number: 4,513,185

[45] Date of Patent: Apr. 23, 1985

[54] FLOAT OPERATED ELECTRICAL SWITCH ASSEMBLY

[75] Inventor: John Walters, Walsall, England

[73] Assignee: Lucas Industries, Birmingham, England

[21] Appl. No.: 457,373

[22] Filed: Jan. 12, 1983

[30] Foreign Application Priority Data

Jan. 19, 1982 [GB] United Kingdom ................. 8201425

[51] Int. Cl.[3] ............................................ H10H 35/18

[52] U.S. Cl. .................................. 200/84 C; 335/154; 73/322

[58] Field of Search .......... 200/84 C, 19 M, 61.45 M, 200/61.52; 335/154; 73/322, 322.5

[56] References Cited

U.S. PATENT DOCUMENTS

| | | | |
|---|---|---|---|
| 3,562,735 | 2/1971 | Goodlaxson | 200/84 C |
| 3,868,485 | 2/1975 | Sykes | 200/84 C |
| 3,934,103 | 1/1976 | Walstra | 200/84 C |

FOREIGN PATENT DOCUMENTS

| | | | |
|---|---|---|---|
| 0007763 | 2/1980 | European Pat. Off. . | |
| 2233698 | 6/1973 | France . | |
| 550303 | 1/1943 | United Kingdom | 200/84 C |
| 1272381 | 4/1972 | United Kingdom . | |
| 1270700 | 4/1972 | United Kingdom . | |
| 1301630 | 1/1973 | United Kingdom . | |

OTHER PUBLICATIONS

Machine Design, May 18, 1972, pp. 130–133.

European Search Report, Berlin, Sep. 17, 1979, Examiner: Ruppert.

*Primary Examiner*—E. A. Goldberg
*Assistant Examiner*—M. Reinhart
*Attorney, Agent, or Firm*—Staas & Halsey

[57] ABSTRACT

A float operated electrical switch assembly including a body, a float coupled to the body for pivotal movement relative thereto about a first axis, a permanent magnet carried by the float and having its dipole axis parallel to the first axis, and a reed switch within the body is disclosed. The reed switch is positioned with its longitudinal axis at right-angles to the float pivot axis, and, the pivot axis is spaced transversely from the longitudinal axis of the reed switch. The magnet is so positioned relative to the pivot axis that within the intended operating arc of the float relative to the body, the movement of the magnet relative to the reed switch is, in effect, movement of the magnet along the length of the reed switch; the magnet being adjacent one end of the reed switch at one end of the arc, and being adjacent the contact region of the reed switch at the other end of the arc.

4 Claims, 9 Drawing Figures

FLOAT OPERATED ELECTRICAL SWITCH ASSEMBLY

This invention relates to a float operated electrical switch assembly of the kind including a body having a float pivotally attached thereto, a permanent magnet carried by the float, and a reed switch carried by the body and operable by movement of the magnet relative thereto.

The usual arrangement of a float operated electrical switch assembly of the kind specified is to position the electrical switch with the reed switch extending horizontally, and the pivot axis of the float also extending horizontally but at right angles to the length of the magnet. In the known arrangement, for example as illustrated in U.S. Pat. No. 3,868,485 the pivot axis of the float intersects, or is adjacent an extension of the longitudinal axis of the reed switch whereby movement of the float relative to the body of the switch moves the permanent magnet towards or away from the reed switch. The dipole axis of the magnet extends at right angles to the pivot axis of the float and when the magnet is positioned close to the reed switch the magnetic field of the magnet, in the region of the contacts of the reed switch is sufficiently strong to close the contacts against their inherent resilience which tends to open the contacts. As the float pivots in a direction to move the magnet away from the reed switch the field in the region of the reed switch weakens allowing the contacts to open. The arrangement is such that both in the closed position of the contacts, and in the open position of the contacts opposite magnetic poles are induced in the two contacts respectively. However, the strength of the field when the magnet is spaced from the contacts is insufficient for the attraction between the oppositely induced poles to overcome the resilience of the contacts, and so the contacts open.

Such arrangements, where the operation of the reed switch is controlled by the movement of the magnet transverse to the length of the reed switch, suffer from several disadvantages. Firstly, the point in the movement of the float at which the field strength is sufficient to overcome the resilience of the contacts is somewhat indeterminate, this problem being made worse by inevitable tolerances in the resilience of the contacts of allegedly identical reed switches. Furthermore, variations in temperature give rise to variations in field strength, and this in turn gives rise to variation in the point in the movement of the float at which operation of the reed switch contacts occurs. Thus where the float operated switch is being used to monitor the level of a liquid the temperature of which changes in use, for example the coolant level in a vehicle radiator, then as the liquid temperature changes the liquid level at which reed switch operation occurs will also change.

There is a class of float operated electrical switch assembly wherein the foregoing problems are minimised. British patent application No. 2020910A illustrates such a switch assembly, wherein the float, rather than being pivoted relative to the reed switch, instead moves linearly relative to the reed switch. The reed switch is disposed with its length extending vertically in use, and the magnet carried by the float is moved from a position wherein the magnet is adjacent one end of the reed switch to a position wherein the magnet is adjacent the two contact points of the reed switch. Magnetically the operation of such a switch assembly is quite different to the pivoted arrangement described above. The dipole axis of the magnet is disposed at right-angles to the length of the reed switch, and when the magnet is positioned adjacent one end of the reed switch then opposite magnetic poles will be induced in the two contacts of the reed switch respectively. Thus the contacts will be attracted towards one another and in the event that the contacts are of the normally open type then the contacts will close against their inherent resilience. However, when the magnet is moved along the length of the reed switch, to approximately the midpoint of the length of the reed switch so that the magnet is adjacent the contacts of the reed switch then the magnetic poles induced in the two contacts of the reed switch will be like poles and the contacts will thus repel each other and the switch will open.

It will be recognised therefore that in the first-mentioned conventional switch assembly the operation arises from the strengthening and weakening of the magnetic field in the region of the contacts. However, in the assembly described immediately above the operation arises from a reversal of the field, that is to say a reversal of the magnetic pole induced in one of the contacts of the reed switch. The operation is thus considerably more positive than in the previously described arrangement, and furthermore is substantially unaffected by temperature changes. However, the linear sliding float arrangement is itself subject to practical disadvantages in that it is extremely difficult economically to manufacture an assembly wherein the float will slide linearly relative to the length of the reed switch. The float must be able to slide freely upon its linear guide, but on the other hand the magnet must be relatively small, and therefore must be positioned close to the reed switch. It is found in practice that accommodating these criteria often gives rise to an arrangement wherein the float will stick at points along its guide, and so will not give an accurate indication of the liquid level which the float is intended to monitor. Moreover, where the liquid level is not static, for example in a vehicle cooling system radiator, wherein the liquid is subject to vibration and lateral forces, as the vehicle moves, the problems of the float sticking on its guide are worsened.

It is an object of the present invention to provide a float operated electrical switch assembly of the kind specified wherein the problems of both of the aforementioned known types of float operated switch assembly are minimised.

A float operated electrical switch assembly according to the invention includes a body, a float coupled to the body for pivotal movement relative thereto about a first axis, a permanent magnet carried by the float and having its dipole axis parallel to said first axis, a reed switch within the body, the reed switch being positioned with its longitudinal axis at right-angles to said first axis, and, said first axis being spaced transversely from the longitudinal axis of said reed switch, and said magnet being so positioned relative to said first axis that within the intended operating arc of pivotal movement of the float relative to the body the movement of the magnet relative to the reed switch is in effect movement of the magnet along the length of the reed switch, the magnet being adjacent one end of the reed switch at one end of said arc, and being adjacent the contact region of the reed switch at the other end of said arc.

Preferably said first axis is so positioned in relation to the length of the reed switch that it is spaced transversely from a point intermediate said one end of the reed switch and said contact region of the reed switch.

Desirably said magnet is in the form of a cylinder of circular cross-section, the dipole axis of the magnet being the cylindrical axis of the magnet.

Conveniently said body is hollow, and said reed switch is disposed within the enclosure defined by the body.

In the accompanying drawings.

Figure 1:
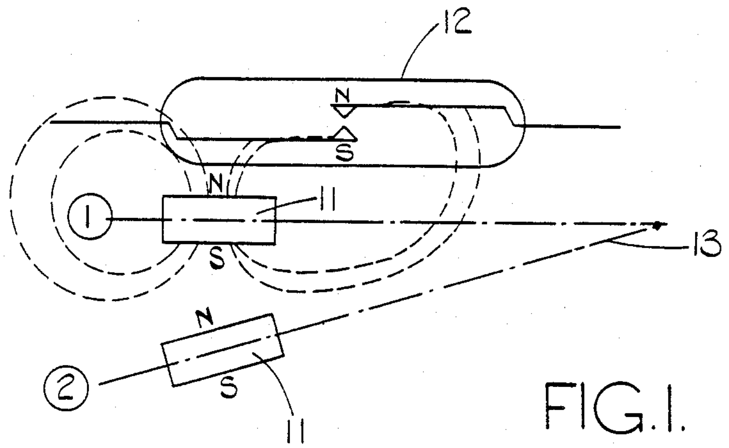
FIG. 1 is a diagrammatic illustration of a first known float operated electrical switch assembly.

Referring first to FIG. 1 of the drawings, it can be seen that in the conventional switch the float which carries the permanent magnet 11 is pivoted on the body which carries the reed switch 12 for movement about an axis 13 spaced longitudinally of the reed switch 12 from the contact region of the switch 12. The dipole axis (N-S axis) of the magnet extends at right angles to the pivot axis 13 and the magnet is moved laterally towards and away from the reed switch by movement of the float about the axis 13. Thus in a normally open reed switch, that is to say one where the contacts are spring urged apart, when the magnet 11 is in position 1 close to the reed switch 12 a south pole is induced in one of the contacts of the reed switch while a north pole is induced in the other contact. Since opposite poles attract the contacts are attracted towards one another and since the magnet is close to the reed switch the field strength is sufficient for the contacts to close against their inherent resilience.

When the float moves about axis 13 so that that magnet 11 achieves position 2 the only magnetic change which takes place is that the field strength is weakened. Thus the contact which had a south pole induced in it still remains as a south pole, and similarly the north pole contact still remains as a north pole. However, because the magnet is further away the field strength is weakened, and the attraction between the induced poles in the contacts is not sufficient to maintain the contacts closed against their inherent resilience. Thus when the magnet is in position 2 the contacts open, and the contact will close again when the magnet is in position 1. The exact point of closure and opening during the movement of the magnet between positions 1 and 2 will vary as the ambient temperature varies, and so will be indeterminate. Moreover, in a batch of allegedly identical reed switches 12 there will be tolerances in the manufacture and assembly of the contact blades so that given identical magnets moving through identical arcs the reed switches will not all operate at the same point in the arc.

Figure 2:
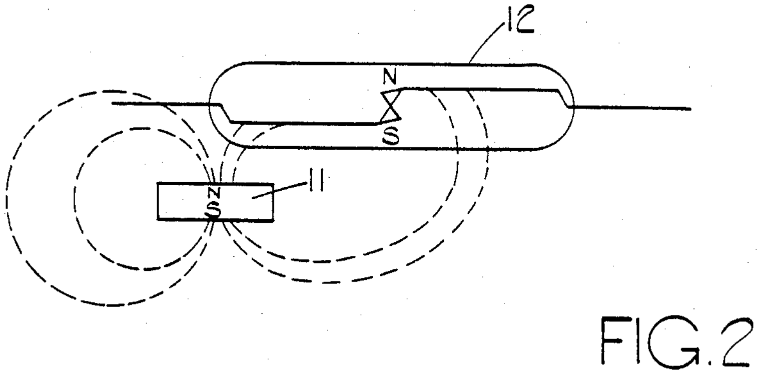
FIG. 2 is a view similar to FIG. 1 of a second known form of float operated electrical switch assembly in a first operative condition.
Figure 3:
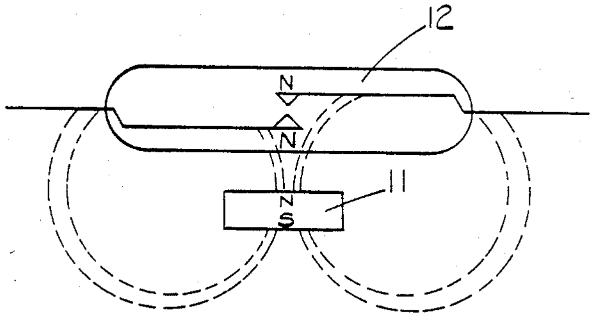
FIG. 3 is a view similar to FIG. 2 of the second switch assembly in its other operative condition.

FIGS. 2 and 3 illustrate a further known form of switch in which the float, and therefore the magnet 11, moves linearly parallel to the length of the reed switch 12. Although FIGS. 2 and 3 illustrate the reed switch 12 and the path of movement of the magnet 11 as horizontal it will be recognised that normally the reed switch and the path of movement of the magnet will be positioned vertically.

In FIG. 2 the float is at one end of its range of movement, and it can be seen that the magnet is adjacent one end of the reed switch 12. Thus a strong north pole is induced in one of the contacts of the reed switch while a strong south pole is induced in the other contact. The contacts are normally open contacts and so the induced pole will have sufficient attraction to close the contacts against their inherent resilience. Movement of the float to its other limit position moves the magnet 11 (as shown in FIG. 3) to a position adjacent the contacts. It can be seen that the field of the magnet causes the pole induced in one of the contacts to be reversed, so that both contacts now have poles of the same magnetic polarity induced therein. Since like poles repel the two contacts will repel each other and the contacts will open. Clearly therefore the arrangement of FIGS. 2 and 3 illustrates a switch assembly having a positive opening and closing action. However, as mentioned previously there are disadvantages in a switch assembly having a linearly moving float, in that satisfactory linear sliding movement of the float is difficult to achieve.

Figure 6:
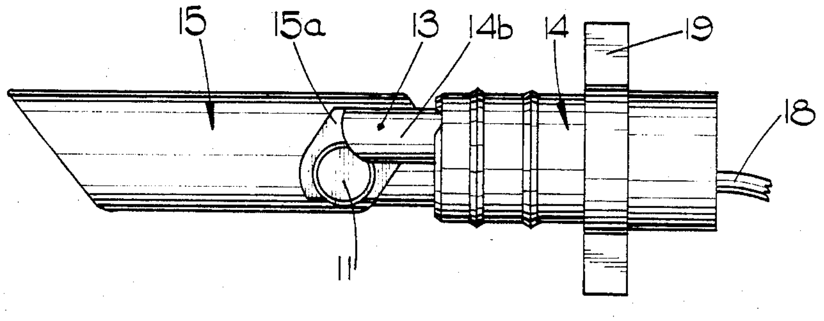
FIG. 6 is a side elevational view of a practical embodiment of the switch assembly in accordance with said one example of the invention, and corresponds with FIG. 4.
Figure 7:
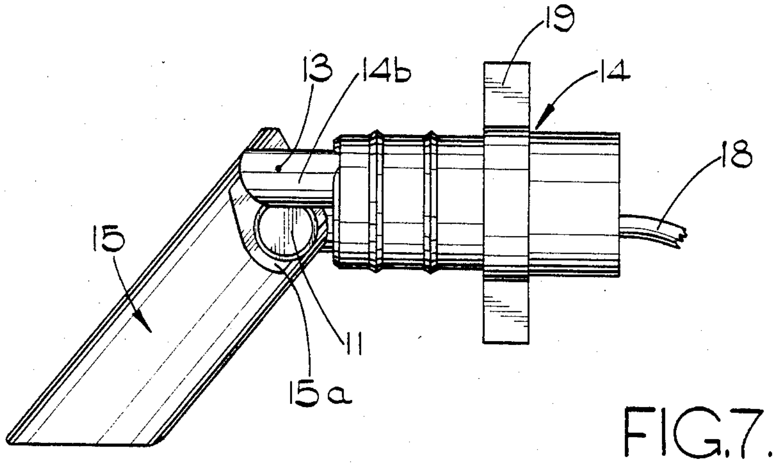
FIG. 7 is a view similar to FIG. 6 but corresponding with FIG. 5 in that it shows the other operative condition.

Referring now to FIGS. 6 to 9 it can be seen that a switch in accordance with one example of the present invention includes a hollow cylindrical moulded synthetic resin body 14 (conveniently formed from the material known under the Trade Mark NORYL) and a moulded synthetic resin float 15 (conveniently moulded polypropylene foam). The float 15 is coupled to the body 14 for pivotal movement about an axis 13, FIG. 6 showing the float in one limit position, and FIG. 7 showing the float in its opposite limit position.

The body 14 includes, at one end, a hollow extension 14*a* which is narrower than the remainder of the body, and which overlaps a similar narrowed region 15*a* of the float 15. The axis 13 passes through the regions 14*a* and 15*a* and the body includes a tongue 14*b* parallel to the extension 14*a* and defining therewith a gap within which the region 15*a* of the float 15 is received. The tongue 14*b* and the extension 14*a* have integral mutually presented pegs which are received within corresponding apertures of the region 15*a* of the float to define the pivot connection between the float and the body.

The region 15*a* of the float has a bore extending therethrough parallel to the axis 13, the bore receiving within it a cylindrical permanent magnet 11 formed from ferrite material. The permanent magnet 11 has its dipole axis parallel to the axis 13 and thus presents one polar face to the extension 14*a* of the body 14, and presents its opposite polar face to the tongue 14*b*.

Supported within the body 14 is a printed circuit board 16 upon which a normally open reed switch 12 is mounted. The printed circuit board 16 includes a narrow extension carrying the reed switch 12, the narrow extension lying within the extension 14*a* of the body 14. Electrical connections to the two contacts of the reed switch 12 are made by way of conductive tracks on the printed circuit board 16 and additionally the printed circuit board 16 carries electrical components 17 associated with the reed switch 12. Connecting leads 18 extend from the end of the body 14 remote from the float 15, the leads 18 being connected to appropriate conductive tracks of the board 16 prior to use. The hollow body is filled with an encapsulant to protect the printed circuit board and components and to retain the printed circuit board in position in the body.

Figure 4:
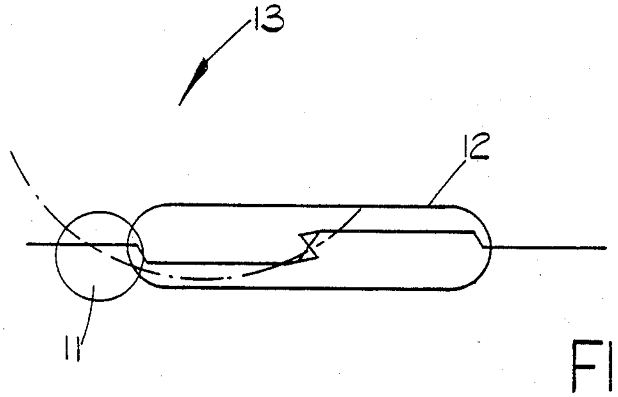
FIGS. 4 and 5 are views similar to FIGS. 2 and 3 respectively of a float operated electrical switch assembly in accordance with one example of the present invention.
Figure 5:
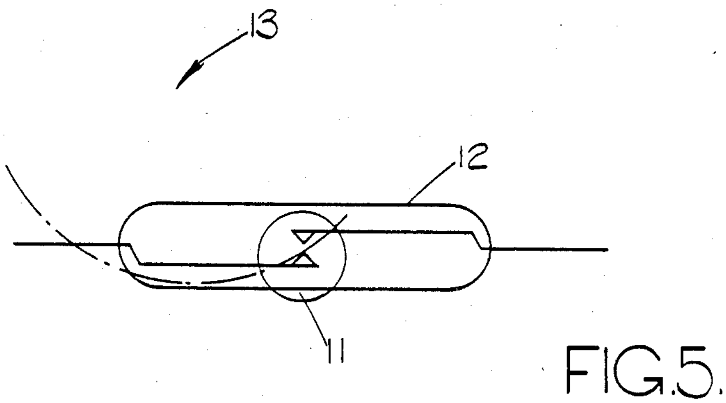

The reed switch 12 lies beneath the axis 13 and has its longitudinal axis extending at right angles to the axis 13. In the arrangement illustrated in FIGS. 8 and 9 the axis 13 is thus spaced laterally of the length of the reed switch 12 and is aligned laterally with the contact region (that is to say the midregion) of the reed switch. However, FIGS. 4 and 5 illustrate the optimum relationship between the axis 13 and the contact region of the reed switch 12 and it can be seen that in a transverse direction the axis 13 is aligned with a point substantially midway between the contact region and the front end region of the reed switch 12.

The relative positions of the axis 13, the reed switch 12, and the magnet 11 are so chosen that during movement of the float 15 relative to the body 14 between its limit positions the movement of the magnet relative to the reed switch 12 is in effect movement along the length of the reed switch. Thus the spacing in a lateral direction between the polar face of the magnet and the reed switch does not vary throughout the whole range of movement of the float, but the magnet is moved from adjacent the front end of the reed switch to a position aligned with the contact region of the reed switch and it is in this sense that the movement of the magnet is in effect movement along the length dimension of the reed switch. This is illustrated clearly in FIGS. 4 and 5 where FIG. 4 shows the position of the magnet 11 when the float is in the position shown in FIG. 6 and FIG. 5 shows the position of the magnet 11 when the float is in the position shown in FIG. 7. The chain dotted arc in FIGS. 4 and 5 illustrates the path of movement of the cylindrical axis of the magnet as the float moves between its limit positions.

Figure 8:
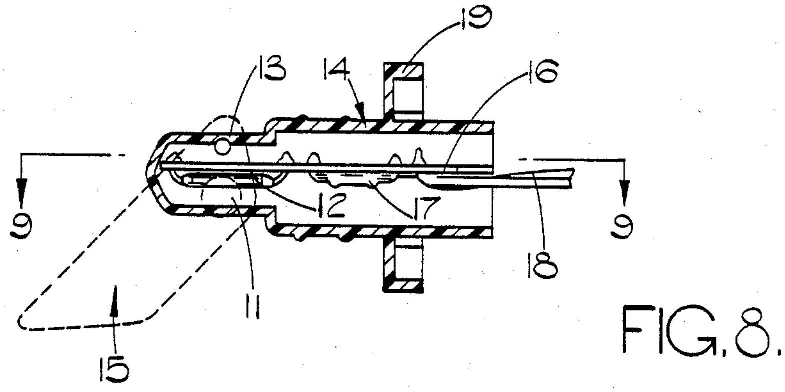
FIG. 8 is a sectional view of the switch assembly illustrated in FIG. 7.
Figure 9:
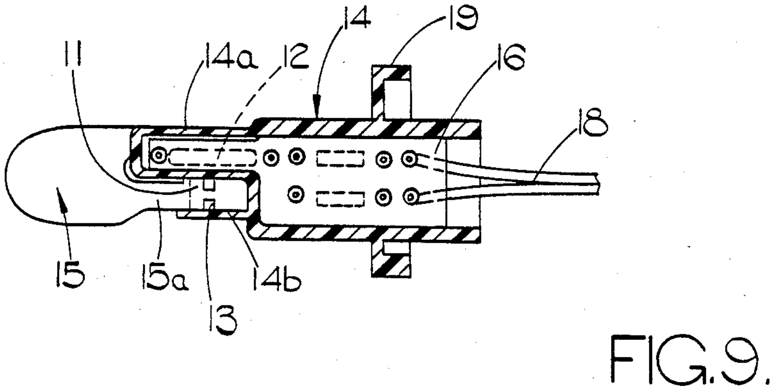
FIG. 9 is a sectional view on the line 9—9 of FIG. 8.

The positioning of the axis 13 aligned with a point midway between the contact region and the end region of the reed switch, but spaced laterally from the reed switch permits the dipole axis of the magnet to intersect the reed switch centre line at both ends of the arc although it passes down below the centre line of the reed switch at the midpoint of its arc. This is the optimum position of the axis 13 along the reed switch length. However the arrangement shown in FIGS. 8 and 9 is still satisfactory and is more convenient to manufacture when faced with the body and float shapes shown in the drawings. Although the magnet dipole axis does not intersect the reed switch axis in the second position satisfactory operation is achieved since the spacing of the dipole axis from the switch axis is small by comparison with the diameter of the magnet. In a minor modification of the arrangement shown in FIGS. 6 to 9 the pivot axis 13 has been moved closer to the optimum position and lies between the optimum illustrated in FIGS. 4 and 5 and the position shown in FIGS. 6 to 9. The change has been effected without significant alteration of the body and float shapes shown in FIGS. 6 to 9.

It will be recognised that in the two limit positions of the magnet 11 (FIGS. 4 and 5) the reed switch will operate in exactly the same manner as is described with reference to FIGS. 2 and 3. The switch assembly although employing a pivoted float has an operating arrangement embodying the advantages of the sliding float arrangement of FIGS. 2 and 3. Thus the switch assembly described above with reference to FIGS. 4 to 9 embodies the advantageous magnetic operation of the known form of switch assembly shown in FIGS. 2 and 3 in that it affords a very positive switching action while avoiding the mechanical problems associated with a sliding float. Similarly, the switch assembly of FIGS. 4 to 9 embodies the advantageous mechanical arrangement of a pivoted float while avoiding the indeterminate magnetic operation of the known assembly illustrated in FIG. 1.

Conveniently the magnet 11 is retained in the bore of the region 15*a* of the float by hot deforming the material at the ends of the bore to trap the magnet within the bore. Intermediate its ends the body 14 is formed with an integral mounting flange 19 whereby the body is anchored to the wall of a liquid container the liquid level of which is to be monitored. Thus the part of the body 14 to the left of the flange 19, and the float 15 project into the container through an aperture in the wall thereof and are positioned with the axis 13 and the longitudinal axis of the reed switch 12 horizontal. When the liquid level is low the float 15 will move to the position shown in FIG. 7, and as the liquid level rises the float will rise with it until it reaches the position illustrated in FIG. 6.

The assembly illustrated in FIGS. 4 to 9 is suitable for use in monitoring the coolant level in the cooling system radiator or header tank of a vehicle internal combustion engine cooling system.

In the example described above the reed switch is of the normally open type. However a similar arrangement could be provided using a normally closed reed switch. The usual type of normally closed reed switch is a normally open switch incorporating a small magnet which magnetically biases the normally open contacts to a closed position. Using such a switch then in the FIG. 4 position the magnet 11 would augment the inbuilt magnet in maintaining the contacts closed, while in the FIG. 5 position the effect of the magnet 11 would negate the inbuilt magnet and cause the contacts to open. Another reed switch having normally closed contacts is a normally open reed switch having an additional contact formed from non-magnetic material against which one of the normally open contacts abuts in the rest condition of the switch. Such a switch is really a changeover switch but where a normally closed switch is required only the normally closed pair of contacts is utilized. The operation in a switch assembly as described with reference to FIGS. 4 to 9 would be as described above except that in the FIG. 4 position the normally closed contacts would be open (the normally open pair being closed) and in the FIG. 5 position the normally closed contacts would be closed (the normally open pair being open).

If a true normally closed switch were available (wherein the sole pair of contacts were urged into engagement with one another by their inherent resilience) then again such a normally closed switch could be incorporated into an assembly as shown in FIGS. 4 to 9. In the FIG. 4 position of the magnet the effect of the magnet 11 would overcome the resilience of the contacts and thus would open the contacts whereas in the FIG. 5 position of the magnet the magnet 11 would assist the contact resilience to ensure that the contacts close.

What is claimed is:

1. A float operated electrical switch assembly including a body having a longitudinal axis, a float coupled to the body for pivotal movement relative thereto about a first axis being perpendicular to the longitudinal axis of the body, a permanent magnet carried by the float and having a dipole axis parallel to said first axis, a reed switch within the body, the reed switch being position with its longitudinal axis parallel to the longitudinal axis of the body and at right-angles to said first axis, and, said first axis being spaced transversely from the longitudinal axis of said reed switch, and said magnet being so positioned relative to said first axis such that the intended operating arc of pivotal movement of the magnet relative to the reed switch is in effect movement of the magnet along the length of the of the reed switch, the magnet being adjacent one end of the reed switch at one end of said arc, and being adjacent the contact region of the reed switch at the other end of said arc.

2. An assembly as claimed in claim 1, wherein said first axis is so positioned in relation to the length of the reed switch that it is spaced transversely from a point intermediate said one end of the reed switch and said contact region of the reed switch.

3. An assembly as claimed in claim 2, wherein said magnet is in the form of a cylinder of circular cross-section, the dipole axis of the magnet being the cylindrical axis of the magnet.

4. An assembly as claimed in any one of claim 3, wherein said body is hollow, and said reed switch is disposed within the enclosure defined by the body.

* * * * *